United States Patent
Sanchez

Patent Number: 5,631,661
Date of Patent: May 20, 1997

[54] GEOMETRICALLY OPTIMIZED ANECHOIC CHAMBER

[76] Inventor: Gabriel A. Sanchez, P.O. Box 711719, Santee, Calif. 92072-1719

[21] Appl. No.: 497,536

[22] Filed: Jun. 30, 1995

[51] Int. Cl.⁶ .................................................. G01R 29/08
[52] U.S. Cl. ........................................................ 343/703
[58] Field of Search ................................. 343/703, 786; 342/1, 165

[56] References Cited

U.S. PATENT DOCUMENTS

| | | | |
|---|---|---|---|
| 3,806,943 | 4/1974 | Holloway | 343/703 |
| 4,218,683 | 8/1980 | Hemming | 343/703 |
| 4,507,660 | 3/1985 | Hemming | 342/1 |
| 5,001,494 | 3/1991 | Dorman et al. | 343/703 |
| 5,119,105 | 6/1992 | Ngai et al. | 343/703 |
| 5,270,723 | 12/1993 | Lopez et al. | 343/703 |
| 5,430,456 | 7/1995 | Osburn et al. | 343/703 |
| 5,440,316 | 8/1995 | Podgorski et al. | 343/786 |

*Primary Examiner*—Donald T. Hajec
*Assistant Examiner*—Tan Ho
*Attorney, Agent, or Firm*—Ralph S. Branscomb

[57] ABSTRACT

A radio frequency anechoic chamber utilizes an expanded central volume defined by two flared pyramidal horns with their outer rims joined together, with the flared sections tapering into rectangular cross-sectioned end volumes on opposite ends of the overall chamber. One end houses the transmitting or receiving antenna and the other end houses the items under test. The transitions between the flared and rectangular sections are configured to minimize diffraction effects and reflections which occur when an electromagnetic wave encounters an edge or surface discontinuity. By reducing reflections and diffraction a near-uniform wave arrives at the item under test, and the more uniform the illumination, the more accurate the results of the test.

6 Claims, 2 Drawing Sheets

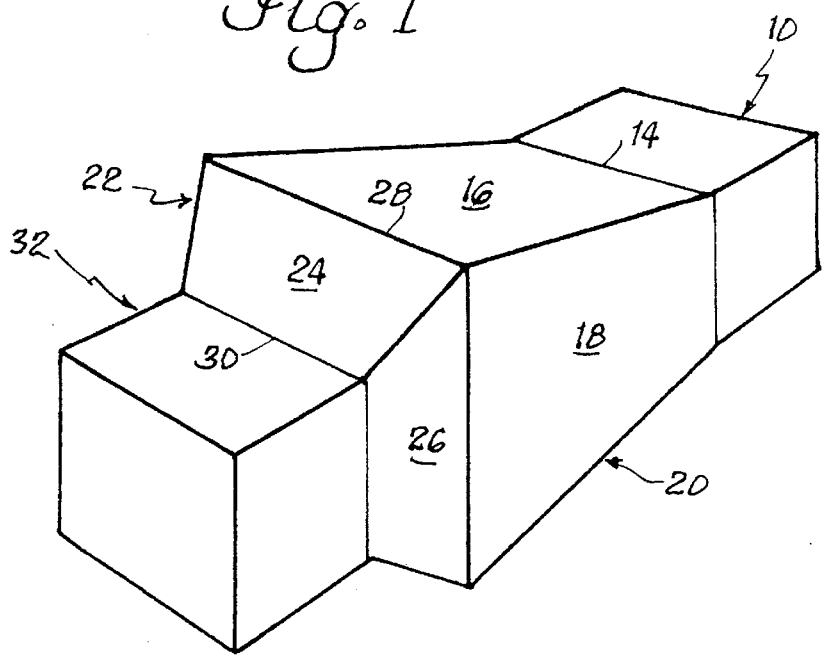
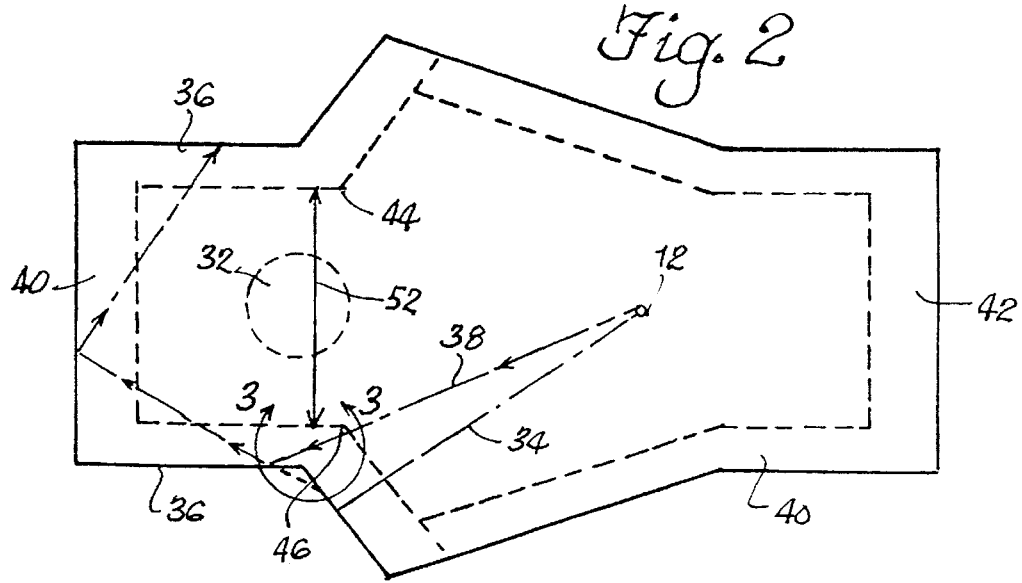
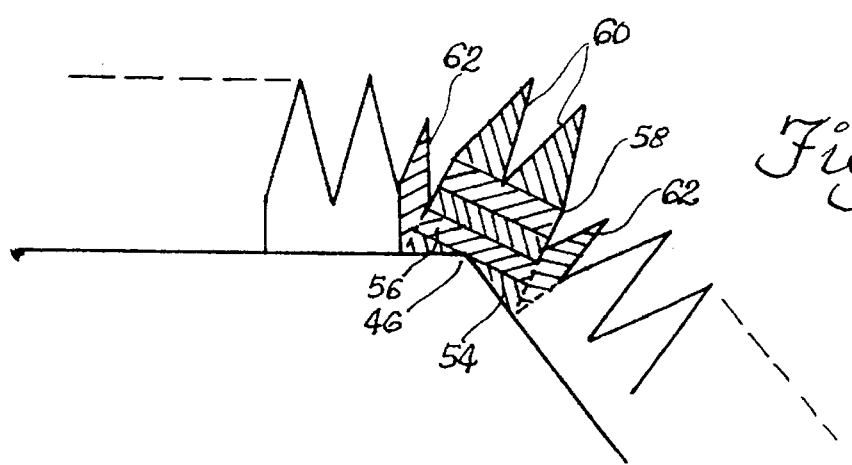

GEOMETRICALLY OPTIMIZED ANECHOIC CHAMBER

BACKGROUND OF THE INVENTION

The invention is in the field of radio frequency anechoic chambers used to test the electromagnetic susceptibility of, and the emissions from, electronic equipment.

All electronic equipment capable of emitting radio frequency radiation must be tested for RF emission levels before being cleared for production and distribution in the United States. The sheer quantity of such equipment, the limited bandwidth available for communication carrier frequencies and population density make it necessary for electronic devices to be made to operate electrically "quietly" in such a manner as not to interfere with communications and controls.

To determine the level of unwanted emissions in equipment, a specimen computer or microwave oven, for example, is enclosed with a broad-band receiving antenna in an anechoic chamber covered with metal to neutralize ambient radiation and lined with absorber material, and the amplitude of emitted radiation over the test band is measured with the test piece in operation.

The second type of test that requires an anechoic chamber is the RF susceptibility test. The purpose of the test is to ensure that electronic equipment can remain functional when irradiated by high levels of RF energy. Military aircraft offer the most significant example of the need for this type of test. The radiation intensity of nuclear explosions has spurred the conversion of the wiring harnesses of fighters and bombers to fiber optic cables, which are immune to radio interference, but the actual circuits with components cannot be made completely transparent to RF frequencies. Automobile controllers are also subject to radiation-caused malfunction, and are tested for RF susceptibility at transmission amplitudes of 200 volts across a wide frequency band to ensure their survivability under electromagnetic stress. Susceptibility testing does not require receiving and measuring radiation amplitude with an antenna, since the amplitude of the transmitted wave is known from gages on the wave generating equipment.

In both the emission and the susceptibility test it is important that the radiation propagating between the source antenna and test piece be uniform and not altered in magnitude from one point to another. To achieve this, and to eliminate outside random radiation that would skew the test results, the tests are conducted in an anechoic chambers designed to approximate as closely as possible the ideal situation in which no ambient radiation is admitted into the chamber and all radiation purposefully generated in the chamber uniformly illuminates the item under test.

The chambers used for this purpose were originally square box-shaped rooms lined on the inside with RF absorbing material to minimize reflections, with the antenna and test piece being located at opposite ends of the room. The rooms were square rather than elongated or rectangular, until a dozen years ago when the original square shape gave way to a flared chamber with a central outward bulge between the test piece and the antenna housed in the respective opposite ends. The flared chamber represented a substantial advance in the state-of-the-art in chamber design, as is detailed in the original patent on a chamber of this shape, U.S. Pat. No. 4,507,660 issued on Mar. 6, 1985 to a colleague of the instant inventor, Leland H. Hemming.

The flared shape enabled the chamber to be narrowed, considerably reducing the construction cost due to the savings on the absorber material required to line the reduced wall area. Without the flare, a square chamber is superior to an elongated one, since the high level of reflection of the low-angle incident radiation in an elongated rectangular chamber destroys the uniformity of the incident waveform. The innovation of the mated-horn style enabled the economic advantage of the elongated shape to be enjoyed without the low-angle reflections, since the flare meets most incoming radiation head-on, at the most absorptive angles.

As discussed in the referenced patent, anechoic chamber design is completely driven by cost. These chambers are on the order of 80 feet long, 60 feet wide and 40 feet high and cost hundreds of thousands of dollars, with the price tag being a linear function of the wall area covered with the expensive RF absorber material. A cost-reducing design, therefore, is not in the same league as, a good buy on paint for the boardroom at a fire sale. Improvements are constantly being sought to alter the algorithms that define the tradeoff between cost and performance. Even a minor improvement enabling substitution of a slightly smaller chamber could save ten thousand dollars per chamber.

As chamber design driven by this cost imperative has undergone improvements, a performance limitation inherent in the flared design was discovered. Namely, energy that is radiated omnidirectionally from the test antenna diffracts when the wavefront breaks across the edge transitions between the flared central section and the box-shaped end terminations. This diffracted energy disturbs the uniformity of the electromagnetic field illuminating the test object, thus causing errors in the measured emissions, or distortion in the test results of the device under test for radiated susceptibility.

With test radiation wavelengths reaching 30 feet and longer for the worst case low range frequency of 30 Mhz., the aperture framed by the transition discontinuities seen by the wavefront is of the same order of magnitude as the wave itself. This is the parameter needed for reinforcement of diffracted electromagnetic waves, which will cause classic alternating amplitude maxima and minima spaced according to the wavelength of the illuminating energy and the distance of the source, expressed by the equation, lambda=s sin theta, "s" being the spacing between slits, or approximately the width of the aperture, and Theta being the angle of deviation of the diffracted energy from the incident wave.

Correcting this problem is critical to utilizing an anechoic chamber as has been demonstrated. If the advantage of the flared horn chamber can be retained and the disadvantage of the diffracted wave eliminated or substantially reduced, the resulting chamber could replace an even larger equivalent rectangular or square chamber than it does currently.

SUMMARY OF THE INVENTION

Diffraction is reduced by electrically "smoothing" the edge or by improving absorber reflectivity by changes in the geometry of the chamber edges. This is accomplished by combining plural techniques. First, the trouble-causing transition regions are lined with a specially designed absorber having a planar multi-layered foam absorber base loaded with conductive carbon. On top of the base a series of contiguous pyramids extend into the open space central of the chamber to make the electromagnetic transition from carbon-laced base to free air. The electromagnetic signature that this configuration offers to incoming radiation is smoothed and not prone to diffracting radiation that breaks across it. The conductivity of all the various layers of absorbers is carefully designed and controlled to achieve the edge-less, discontinuity-free RF appearance that promotes absorption and defeats diffraction of passing radiation.

In a variation of this procedure, the convex edge-defining walls that are the troublemakers are truncated, and the foam is layered over the resulting flat caused by the truncation rather than being in effect skewered on the ridge or peak of the discontinuity. Over this layered arrangement, the pyramid-shaped absorbers are mounted. A further variation uses a high performance ferrite tile absorber on the truncations to reduce the diffracted energy.

The third enhancement works in conjunction with the absorbers by reducing the proportion of the radiation that reaches the troublesome edges. By replacing the omnidirectional antenna with a directive antenna, the signal reaching the discontinuities is attenuated about 3–6 dB from its previous level which, coupled with the absorber layers, eliminates a major portion of the distortion, which is hard to measure precisely but is estimated to represent on the order of a 6 dB reduction in the diffraction that would otherwise take place.

In addition to treating the edges, it is also important to insure that the wave propagating from the source antenna toward the test object is near-perpendicular to the flared walls of the receive rectangular section. This insures maximum reflectivity (reduction in reflected signal) from the absorber mounted on the flared walls of the chamber.

BRIEF DESCRIPTION OF THE DRAWINGS

FIG. 1 is an isometric view of the chamber exterior;

FIG. 2 is a top plan view of the primary embodiment of the chamber;

FIG. 3 is a section taken through an inside corner of the chamber parallel to the floor wherein the juncture between flared horn and boxy end is smoothed with a tailored arrangement of lossy absorbers;

DETAILED DESCRIPTION OF THE PREFERRED EMBODIMENT

Figure 4:
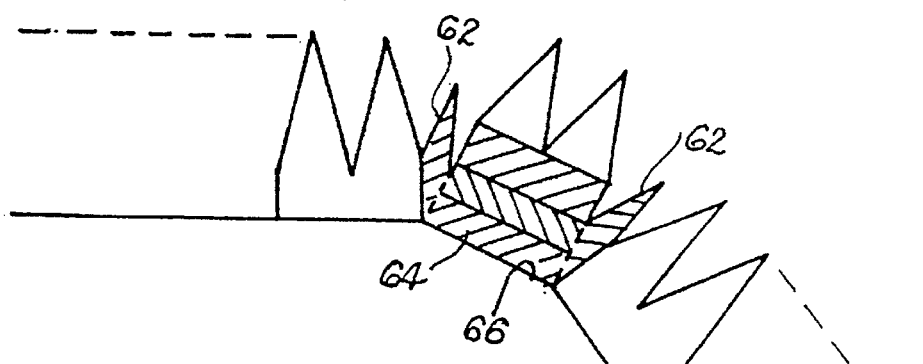
FIG. 4 is a section taken through an inside corner of the chamber taken at an angle parallel to the floor like FIG. 3 but illustrates a modified chamber in which the shape edges have been truncated.

The principal embodiment of the chamber is shown overall in FIGS. 1 and 2. The chamber has metal walls that cover every surface except the floor and form the box end 10 which houses the test antenna 12. The boxy cubicle 10 flares out at 14 to define the sloped top and side walls 16 and 18 of the first horn 20, these walls having leading edges which mate with edges of the second horn 22 which similarly has top and sidewalls 24 and 26 to define the welded ridge seam 28, and from there converge down to the seam 30 where they attach to the the edges of the boxy target region or test cubicle 32. The horns are almost mirror images of one another except that horn 20 is noticeably larger than horn 22.

The differently-sized horns result in the tapered walls 16 and 18 being angled such that the incoming radiation strikes at almost 90° as indicated at 34, with deviations from normal being less than about 20°. Within this range of about 70° to 110° incident radiation is absorbed at the 99% level, and even up to 99.9% with some frequencies. The sidewalls 36 of the small end box 32 receive incoming radiation at much shallower angles as indicated at 38, but these rays make at least two bounces as indicated, being attenuated with every bounce, so the usual radiation patterns do not produce erratic or problematic results.

All absorption is done by the lossy liners of the interior walls of the chamber indicated at 40 and being thicker at the rear end 42 as only a single reflection separates radiation from the target. The liner material may be multilayered slabs, or pyramidal or conical projections, the important factor being that the foam of the liner is impregnated with lossy carbon or other conductor which absorbs radiation in the RF frequency range. The resistance loading field of the pyramidal layered absorber should taper gradually to match the impedance of the wall surface with the very high impedance of free space.

Figure 5:
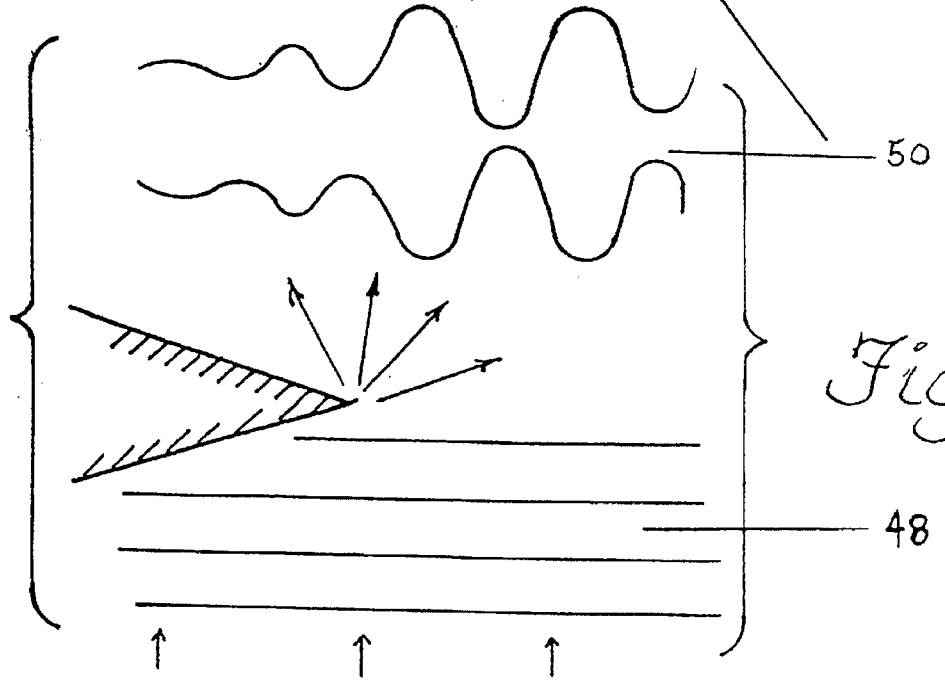
FIG. 5 is a diagrammatic view of the interior of the chamber illustrating a waveform incident on a discontinuity from the right, where it is diffracted and partially scattered to produce the nonuniform reinforcement pattern on the left.
Figure 6:
FIG. 6 diagrammatically illustrates wave amplitude monitored by a probe along the X-axis in a chamber without diffraction correction; and, FIG. 7 is a diagram produced identically to the diagram of FIG. 6 but in a chamber that is modified according to the invention.
Figure 7:
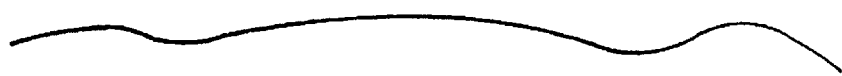

All this smoothness is fine where it can be found, but at the transition corners 44 and 46 under the normal layer of absorber 40, the passing long wavelength waveforms 48 are fragmented by diffraction as shown in FIG. 5 and the alternating reinforcing and cancelling bands coalesce in the continuing wave 50, which is not the uniform wave that it was before striking the discontinuous edges 44 and 46 which frame the effective aperture 52. It will be understood that these diagrammatic representations do not really represent anything of similar appearance in the radiation, but merely offer a model that puts the phenomenon of diffraction in a context in which it seems logical and from which logical projections can be made about waveform interactions. Likewise the scattering occurring at the aperture is likely in many instances to produce chaotic reinforcement patterns rather than the science-class grid patterns generally associated with diffraction. This is exacerbated by the fact that a continuum of frequencies strike the discontinuities and as can be seen form the equation above the peak intensity spacing is dependent on frequency so that a range of spacings would be superimposed on one another. Suffice it to say that whatever the waveform created by the disturbance, it is inimicable to the uniformity of the waveform and its correction as set for the below improves test results.

The sharp edge is shown in FIG. 3. This projection is so prominent electromagnetically that the wall liner used on the remainder of the the interior walls is inadequate to muffle the eddies created. To accomplish this, a lossy slab 54 is cut to conform to the shape of the offending corner, and this layer is overlaid with a second layer 56 and so forth to build up a multi-layered absorber slab 58 which has increasing levels of lossy conductor material impregnated in the consecutive layers in the direction of the wall of the chamber. The innermost layer is highly loaded with conductive carbon. The individual strata of the multi-layer geometry are carefully selected to provide broadband frequency absorption. As an example, assume the base material is on the order of three feet and the tip section three feet.

The outside layer is feathered to the impedance of free space by means of the contiguous pyramids 60, having a uniform doping of lossy material so that they approach free space impedance as they taper to a point at the inner ends. Continuity filer blocks 62 are inserted as shown in the drawings to bridge the physical gaps on opposite sides of the main absorber. Both the pyramids and the filler blocks act to intercept much of the incoming radiation head-on.

Further reduction of the diffraction effects can be achieved with only sightly greater expense by truncating the edges as shown at 66 in FIG. 4, and then applying multiple layers 64 which are substantially identical to the comparable stack in FIG. 3 except for the first slab layer which need not be cut to accommodate the edge. The same pyramids 62 and filler blocks 64 are used. Alternatively, high-performance ferrite can be used to cover the truncations.

Either of these techniques drastically reduces the edge effect on the wave front, and to even further improve chamber performance.

The smooth impedance transition all but eliminates the effect of the sharp edges on the wave front. The final touch is the replacement of the omnidirectional antenna with the directional antenna 12, which directs the radiation through the aperture rather than against the discontinuities, thereby further reducing the magnitude of the diffracted wave front. The most common antenna available other than the commonly used biconical dipole is the log periodic dipole antenna. Tests have shown that this type of antenna will reduce the diffraction to an acceptable level to enable a uniform wave to illuminate the test region in the chamber. The absorber described above is mounted to this flat location. The flat is designed to be perpendicular to the axis of the corner. Since the absorber is manufactured in 2 ft. by 2 ft. sections, the flat similarly should be cut to accommodate these dimension.

I claim:

1. An RF anechoic chamber comprising:
   (a) an elongated enclosure interiorly lined with electromagnetic wave absorber material;
   (b) said enclosure defining an antenna region at one end and a test cubicle at the other end and having a flared central portion having converging walls which meet walls of said test cubicle and define convex discontinuities therewith such that RF radiation passing through an aperture defined by said convex discontinuities is disturbed; and,
   (c) an absorber mounted over each of said discontinuities comprising a slab of lossy foam flush against the respective discontinuity covered by a plurality of substantially contiguous and parallel converging laterally extended absorber projections which extend toward the interior of the chamber.

2. An RF anechoic chamber according to claim 1 wherein said slab is multilayered, being defined by a plurality of parallel layers, and each layer is impregnated with RF lossy material to various degrees.

3. An RF anechoic chamber according to claim 2 wherein said layers are substantially parallel with the chamber wall at the region of the respective discontinuity such that the layers are spaced to differing degrees from the wall and the layers are increasingly loaded with lossy material progressing in the direction toward the chamber wall.

4. An RF anechoic chamber according to claim 1 wherein said discontinuities are truncated to define a flat surface and said slab is mounted flush against said flat surface.

5. An RF anechoic chamber according to claim 1 and including an antenna in said antenna region and wherein said antenna is a directional antenna directed to avoid radiating on said convex discontinuities.

6. An RF anechoic chamber comprising:
   (a) an elongated enclosure interiorly lined with electromagnetic wave absorber material;
   (b) said enclosure defining an antenna region at one end and a test cubicle at the other end and having a flared central portion having converging walls which meet walls of said test cubicle and define convex discontinuities therewith such that RF radiation passing through an aperture defined by said convex discontinuities is disturbed; and,
   (c) an absorber mounted over each of said discontinuities comprising a grid of ferrite tile covered by a plurality of substantially contiguous and parallel converging absorber projections.

* * * * *